(12) United States Patent
Dal et al.

(10) Patent No.: US 11,868,806 B2
(45) Date of Patent: Jan. 9, 2024

(54) METHOD FOR TASK SCHEDULING WITH A SIMULATED ANNEALING-BASED APPROACH IN THE CLOUD COMPUTING

(71) Applicant: ATATURK UNIVERSITESI BILIMSEL ARASTIRMA PROJELERI BIRIMI, Erzurum (TR)

(72) Inventors: Deniz Dal, Erzurum (TR); Esra Çelik, Erzurum (TR)

(*) Notice: Subject to any disclaimer, the term of this patent is extended or adjusted under 35 U.S.C. 154(b) by 249 days.

(21) Appl. No.: 17/294,848

(22) PCT Filed: Jun. 18, 2020

(86) PCT No.: PCT/TR2020/050526
§ 371 (c)(1),
(2) Date: May 18, 2021

(87) PCT Pub. No.: WO2021/015696
PCT Pub. Date: Jan. 28, 2021

(65) Prior Publication Data
US 2022/0019463 A1 Jan. 20, 2022

(30) Foreign Application Priority Data
Jul. 23, 2019 (TR) .................. 2019/11010

(51) Int. Cl.
G06F 9/48 (2006.01)
H04L 67/10 (2022.01)
H04L 67/60 (2022.01)
G06F 7/58 (2006.01)

(52) U.S. Cl.
CPC ............ *G06F 9/4881* (2013.01); *H04L 67/10* (2013.01); *H04L 67/60* (2022.05); *G06F 7/588* (2013.01)

(58) Field of Classification Search
CPC .............................. G06F 9/4881; H04L 67/10
See application file for complete search history.

(56) References Cited

U.S. PATENT DOCUMENTS

2018/0136976 A1* 5/2018 Ammari ................. G06F 9/505
2018/0329741 A1* 11/2018 Yuan ..................... G06F 1/3228

FOREIGN PATENT DOCUMENTS

CN 109284181 A 1/2019
CN 109542619 A 3/2019

OTHER PUBLICATIONS

Celik et al. "A novel simulated annealing-based optimization approach for cluster-based task scheduling" (Received: Sep. 3, 2020, Published online: May 27, 2021) (Year: 2021).*
Jiao et al. "Cloud Annealing: A Novel Simulated Annealing Algorithm Based on Cloud Model" (Jan. 2020) (Year: 2020).*
Liu et al. "A Task Scheduling Based on Simulated Annealing Algorithm in Cloud Computing" (2018) (Year: 2018).*
International Search Report for corresponding PCT/TR2020/050526, dated Nov. 30, 2020.

(Continued)

Primary Examiner — Sisley N Kim
(74) Attorney, Agent, or Firm — Egbert, McDaniel & Swartz, PLLC

(57) ABSTRACT

A simulated annealing-based metaheuristic method for scheduling tasks in the infrastructures that use cloud computing service with multitasking and multi-node structure that can perform the big data analysis.

15 Claims, 4 Drawing Sheets

(56) References Cited

OTHER PUBLICATIONS

Written Opinion of the International Searching Authority for corresponding PCT/TR2020/050526, dated Nov. 30, 2020.
Liu et al; "A Task Scheduling Based on Simulated Annealing Algorithm in Cloud Computing", International Journal of Hybrid Information Technology, Jun. 9, 2016.
Fanian et al. "A New Task Scheduling Algorithm using Firefly and Simulated Annealing Algorithms in Cloud Computing" International Journal of Advanced Computer Science and Applications (IJACSA), vol. 9 Issue 2, Mar. 2018.
Mandal et al. "Optimal task scheduling in cloud computing environment: Meta heuristic approaches" 2015 2nd International Conference on Electrical Information and Communication Technologies (EICT) Date of Conference: Dec. 10-12, 2015.

\* cited by examiner

TABLE 1
BEST DELAY VALUES OF ALGORITHMS IN THE LITERATURE:

| BENCHMARK | NSGA-II | SaHarage | Min-Min | SGA | cMA | MA | MA+TS | Sen SA |
|---|---|---|---|---|---|---|---|---|
| u_c_hihi.0 | 14071196.1 | 10908697.8 | 8468675.0 | 7752689.0 | 7709297 | 7669920.7 | 7500020.1 | 7377378.2 |
| u_c_hilo.0 | 215624.7 | 167483.2 | 161805.4 | 156680.5 | 153334.8 | 154631.1 | 153917.1 | 153088.7 |
| u_c_lohi.0 | 493480.5 | 349746.0 | 275857.3 | 253926.0 | 251360.2 | 249950.8 | 245286.9 | 239069.9 |
| u_c_lolo.0 | 7022.6 | 5649.8 | 5441.4 | 5251.1 | 5218.1 | 5213.0 | 5173.7 | 5145.5 |
| u_i_hihi.0 | 16981587.8 | 3391758.3 | 3513919.2 | 3161104.9 | 3184647 | 3078735.6 | 3078724.9 | 2931630.9 |
| u_i_hilo.0 | 224802.5 | 78828.2 | 80753.6 | 75598.4 | 75856.6 | 74993.8 | 75108.4 | 72294.3 |
| u_i_lohi.0 | 620779.0 | 125688.6 | 120517.7 | 111792.1 | 110620.7 | 107038.8 | 102808.5 | 101746.3 |
| u_i_lolo.0 | 7462.8 | 2673.8 | 2785.6 | 2620.7 | 2624.2 | 2598.4 | 2596.5 | 2539.1 |
| u_s_hihi.0 | 16179189.2 | 5574357.7 | 5160342.8 | 4435792.2 | 4424540.8 | 4327249.7 | 4321015.4 | 4099580.9 |
| u_s_hilo.0 | 207484.6 | 103400.8 | 104375.1 | 98400.0 | 99283.7 | 97804.7 | 97177.2 | 95764.9 |
| u_s_lohi.0 | 643263.1 | 153094.0 | 140284.4 | 130825.8 | 130014.5 | 127648.9 | 127633.0 | 121184.8 |
| u_s_lolo.0 | 7286.9 | 3727.9 | 3806.8 | 3534.3 | 3522.0 | 3510.0 | 3484.0 | 3425.9 |

FIG. 2

TABLE 2
BEST DELAY VALUES OF ALGORITHMS IN THE LITERATURE:

| BENCHMARK | GA | PGA | TS | CHC | P-CHC | Pu-CHC | Sen SA |
|---|---|---|---|---|---|---|---|
| u_c_hihi.0 | 7689878.7 | 7577921.9 | 7448640.4 | 7599288.4 | 7461819.1 | 7281570.0 | 7377378.2 |
| u_c_hilo.0 | 1558920 | 1549150 | 1532633 | 1549470 | 1537919 | 1531054 | 1530883.7 |
| u_c_lohi.0 | 250118 | 248772.4 | 248672.6 | 251194.9 | 241513.2 | 239260.0 | 239069.9 |
| u_c_lolo.0 | 5239.1 | 5208.3 | 5194.9 | 5225.9 | 5177.5 | 5147.9 | 5145.3 |
| u_i_hihi.0 | 3019844.3 | 2940517.8 | 2957834.0 | 3015048.5 | 2952493.2 | 2938380.8 | 2916303.9 |
| u_i_hilo.0 | 74142.9 | 74030.3 | 73692.8 | 74240.9 | 73639.8 | 73578.0 | 73294.3 |
| u_i_lohi.0 | 104683.0 | 103716.0 | 103863.6 | 103434.0 | 102123.1 | 102050.6 | 101716.3 |
| u_i_lolo.0 | 2577.0 | 2573.4 | 2552.0 | 2576.7 | 2548.9 | 2541.4 | 2539.1 |
| u_s_hihi.0 | 4332248.2 | 4262937.5 | 4168793.8 | 4359146.0 | 4198779.5 | 4103500.3 | 4098580.9 |
| u_s_hilo.0 | 97630.1 | 97505.5 | 961608 | 97888.2 | 966223 | 95787.4 | 95764.9 |
| u_s_lohi.0 | 126438.0 | 125717.0 | 123607.4 | 126238.0 | 125336.9 | 122083.3 | 121484.8 |
| u_s_lolo.0 | 3510.4 | 3480.3 | 3430.5 | 3492.1 | 3450.1 | 3433.5 | 3425.9 |

FIG. 3

METHOD FOR TASK SCHEDULING WITH A SIMULATED ANNEALING-BASED APPROACH IN THE CLOUD COMPUTING

TECHNICAL FIELD

The invention relates to a simulated annealing-based metaheuristic method for scheduling tasks in the infrastructures that use cloud computing service with multitasking and multi-node structure that can perform the big data analysis.

The invention specifically relates to a method that solves the Task Scheduling Problem in Cloud Computing (also known as the Heterogeneous Computing Scheduling Problem, HCSP) in such a way that it can produce optimal or near-optimal values at reasonable times.

PRIOR ART

Heterogeneous Computing Scheduling Problem (HCSP) refers to the task scheduling problem in heterogeneous computing systems (systems that host servers in various configurations) to minimize the duration of the last completed task. HCSP is a difficult problem to solve in homogeneous environments due to the performance losses caused by the use of the architectures with lower number of processors. Instead, heterogeneous computational systems are used to accommodate distributed high-performance machines for computationally intensive operations and provide appropriate task assignments to machines to meet many goals, such as resource utilization. Heterogeneous computing systems are part of the infrastructures that provide cloud computing services. Since each node (server) has a different execution time to run each task, the problem of task scheduling in cloud computing is similar to HCSP in terms of scheduling in heterogeneous environments and the search for the minimum time. The technology, advancing day by day, brings the big data along the way, whose capacity is increasing rapidly and which cannot be processed with traditional algorithms/hardware. In order to store, process, and analyze this data in a reasonable time, distributed big data clusters are required. These infrastructures, which allow rapid and accurate response against the increasing needs, use a large number of methods in the background in the process of transforming the current big data into information. Among these methods, the most basic method for data-information conversion for effective use of the existing resources is linked to a strict task scheduling. Task scheduling is the name of the task-server mapping process that will allow all of the tasks to be used to analyze the big data to be run on the so-called cluster nodes (servers) as soon as possible. When scheduling tasks in the cloud computing, it is possible to create a large number of different scheduling, depending on the number of tasks and nodes to be used. For example, when T being the number of tasks, and N being the number of nodes to deploy tasks, $N^T$ is the number of various tasks scheduling options within all possible combinations. In the Braun Model, the data sets that contain 16 nodes and 512 tasks yield $16^{512}$ different task scheduling, and the data sets that contain 32 nodes and 1024 tasks yield $32^{1024}$ different task scheduling (solution space). (The Braun Model is used to compare the performance of task scheduling algorithms in the cloud and can be accessed at https://www.fing.edu.uy/inco/grupos/cecal/hpc/HCSP/HCSP_down.htm) Based on the size of the solution space ($16^{512}$ corresponds to a value with 617 digits and $32^{1024}$ corresponds to a value with 1542 digits), it is clear that it is not possible to reach the correct scheduling in polynomial time with the algorithms based on brute-force, therefore an approach that will produce the solution in a reasonable time is clearly needed. This shows that task scheduling is an optimization problem that is also categorized as NP-hard and seeks a global minimum. Therefore, the help of metaheuristic approaches is needed to solve this problem in such a way that it can produce near optimal (if possible optimal) values in a reasonable time.

Current studies in the literature (Min-Min [1], Sufferage [1], cMA [2], MA [4], TS [3], MA+TS [4], SGA [5], NSGA-II [6], GA [7], PGA [7], CHC [7], pCHC [7], pμCHC [8]) have performed task scheduling in heterogeneous environments for the search of a minimum time. In all of these existing works, a scheduling is obtained using heuristic or metaheuristic approaches. On the other hand, the maximum 90 seconds (cMA maximum 90 seconds, MA maximum 90 seconds, TS maximum 100 seconds, MA+TS maximum 90 seconds, SGA maximum 90 seconds, GA maximum 90 seconds, CHC maximum 90 seconds, pCHC maximum 90 seconds, pμCHC maximum 90 seconds) restriction was used as the running time for the existing studies. At the same time, the study that reports the best solutions ever found (pμ-CHC) utilized a computational cluster of elite servers. In addition, all available works used 12 famous data sets (16 nodes-512 tasks) belonging to the Braun model and reported the results they obtained. However, the results reported by the existing studies are far from the results obtained by the serial version of the proposed approach.

As a result, the above-mentioned problems that cannot be solved by means of the current techniques, have necessitated an innovation in the relevant technical field.

BRIEF DESCRIPTION OF THE INVENTION

The present invention relates to a method for task scheduling with a simulated annealing-based approach in cloud computing to eliminate the above-mentioned disadvantages and bring new advantages to the relevant technical field.

The main purpose of the invention is to develop a method to solve the problem of task scheduling in cloud computing in a way that can produce optimal or near-optimal values at reasonable times.

Another purpose of the invention is to introduce a method that aims to bring a random first solution that represents the problem at hand to bring it closer to the desired global solution by slowly reducing this temperature at every step starting from the higher temperatures, inspired by the observation that the metals in liquid form at high temperatures have regular crystal structures when they are slowly cooled.

Another purpose of the invention is to create a method, that is converted to a computer program, that considers different random number generation and perturbation techniques, data structures, loop termination conditions, exploitation-exploration rates, and the compiler effects that simulated annealing needs to reduce the running time of the computer program.

Another purpose of the invention is to create a method that is implemented on an FPGA and that makes the task-server mapping in the cloud faster thanks to this hardware.

In order to accomplish all above-mentioned purposes and the ones which will emerge from the following detailed description, the present invention introduces a new method that enables task scheduling with a simulated annealing-based approach that provides task scheduling optimization in cloud infrastructures with multitasking and node structure that performs the big data analysis. Accordingly, the method comprises;

determining the initial temperature, which is one of the main parameters that enable to bring a random first solution representing the problem at hand to the global solution in the simulated annealing approach, determining the cooling ratio ($\alpha$), which is the parameter that enables the initial temperature and the current temperature to be lowered gradually, when the number of inner loop iterations, that is used to determine how many times the perturbation process is performed to obtain the neighboring solutions, reaches its upper limit at each temperature value, determining the freezing point ($\varepsilon$), which is the parameter that enables the decision to terminate the algorithm by comparing the temperature with the new temperature reached as a result of reducing the temperature with the cooling ratio, determining the maximum number of inner loop iterations, which is the parameter that determines how many times the perturbation process will be performed at each temperature in the simulated annealing approach, determining the data structure which forms the programming structure of the one-dimensional (task-oriented) representation in the algorithm, determining the random number generation method that provides the random numbers needed by the initial solution and the other functions in the simulated annealing approach, determining the perturbation method that provides the neighboring solutions by modifying the current solution in the simulated annealing approach, determining the ratio of exploitation/exploration which indicates the rate of the perturbation methods that will also be determined by the proposed approach, creating a time profile that enables the determination and evaluation of the time spent by all functions during the search process, optimizing the cost function that calculates the cost of the solution produced in each iteration in the simulated annealing approach, determining the inner loop early termination (thermal equilibrium) criteria that allows the transition to a new temperature when the certain inner loop early termination condition is achieved, instead of going to the end of the pre-determined iteration at each temperature, determining the outer loop early termination criteria that allows the algorithm to be terminated in the cases where the current solution does not change after certain number of iterations, creating an initial (current) solution using the data structure, the random number generation method and the initial temperature determined by the algorithm, converting the current solution to a new (next) solution by using the perturbation methods and the exploitation/exploration ratio determined by the algorithm, calculating the costs of the generated solutions with the optimized cost function, reducing the temperature by the geometric cooling method by using the cooling ratio ($\alpha$), switching to a new temperature (thermal equilibrium state) if the number of solutions exceeds a threshold set by the user, where the cost of the new (next) solution is less than the cost of the current solution, terminating the program by comparing the freezing point with the new temperature reached as a result of reducing the temperature with the cooling ratio, or by using the outer loop early termination criteria in the cases where the current solution does not change after certain number of iterations, determining the effect of the compiler and optimization flags by means of testing to reduce the compile time of the algorithm and/or improve the performance, running the algorithm serially on a single-core microprocessor that the end-user can easily access and in parallel on a multi-core microprocessor by employing the multi-run method, implementing the proposed method as a hardware on an FPGA.

Some of the keywords and their brief definitions that are frequently used in the description and provide a better understanding of our invention are given below.

Cloud Computing: It is the IT infrastructure that enables large-scale and complex computations and includes software applications, storage services, and processing capacity accessed over the internet.

Task Scheduling: It is the name of the task-server mapping process that will allow all of the tasks to be used to analyze the big data to be run on the cluster nodes (servers) as soon as possible.

Metaheuristic: It is an iterative search process that enables to approach the global solution as a result of the new solutions produced at every step, based on different local solutions in the search space. The aim of the metaheuristic approach, which is a high-level heuristic approach, is to efficiently explore the search space to achieve the most effective solution.

Simulated Annealing: To solve the problems categorized as NP-hard, it is a metaheuristic approach that aims to bring a random first solution closer to the desired global solution by starting from the high temperatures and slowly decreasing this temperature with each step.

Parallel Computing: It is the process of executing the different parts of a computer program concurrently by using more than one processor to obtain the solution of a problem faster.

OpenMP: It is an application development interface that enables multi-processing through a shared memory architecture using specific programming languages (such as C++) on many operating systems.

FPGA: It is a digital integrated circuit consisting of programmable logic blocks and programmable interconnection between these blocks. Unlike ASIC (application specific integrated circuit), it has the flexibility to be reprogrammed for different applications. The circuit to be implemented on the FPGA can be created with a hardware description language.

Verilog: It is a hardware description language used to implement digital designs on FPGA-like hardware.

Multi-Run: It is the name of the technique used to parallelize an algorithm. It is also defined as an asynchronous parallel application and allows the algorithm to be run simultaneously on independent multiprocessors (without exchanging information between processors).

The effectiveness of the proposed approach has been tested with twelve famous benchmarks, each containing 512 tasks with 16 nodes, and 1024 tasks with 32 nodes (servers), created with the Braun model, which is used to compare the performances of task scheduling algorithms and is accessed via the web-page (https://www.fing.edu.uy/inco/grupos/cecal/hpc/HCSP/HCSP_down.htm). The proposed approach also considers the maximum 90-second restriction used by the other heuristic or metaheuristic approaches in the literature. At the same time, no special hardware or parallel cluster is used; on the contrary, a laptop that any end user can easily access has been utilized as a test environment. However, despite the use of the same time constraint in the heuristic or metaheuristic approaches in the literature and the utilization of a cluster of elite servers (pµ-CHC) in the study that reported the best solutions ever found, the results that they obtained from the 12 famous data sets (data sets containing 16 nodes-512 tasks and 32 nodes-1024 tasks) are far from the results obtained with the serial and parallel versions of the proposed approach. Even the method applied on a multi-core computer that the end user can easily access has produced better results than its competitors in the literature. With the utilization of the hardware to be obtained by implementing our method on FPGA, near-optimum results can be obtained in a shorter period of time. Because the implementation of the solution directly on hardware will significantly shorten the running time, this gain from time will allow us to execute more of the solution steps we recommend in our method. This will make it possible to produce solutions as close to optimal as possible.

In order to be able to understand the advantages of the structure of the present invention along with its additional elements, it is necessary to evaluate it with the figures explained below.

BRIEF DESCRIPTION OF THE FIGURES

FIG. 2 gives a table comparing the best delay values reached in the literature and the method (Serial SA) of our invention for twelve famous benchmarks, each with 512 tasks and 16 nodes (server) created with the Braun model.

FIG. 3 gives another table comparing the best delay values reached in the literature and the method (Serial SA) of our invention for twelve famous benchmarks, each with 512 tasks and 16 nodes (server) created with the Braun model.

REFERENCE NUMBERS

Figure 1A:
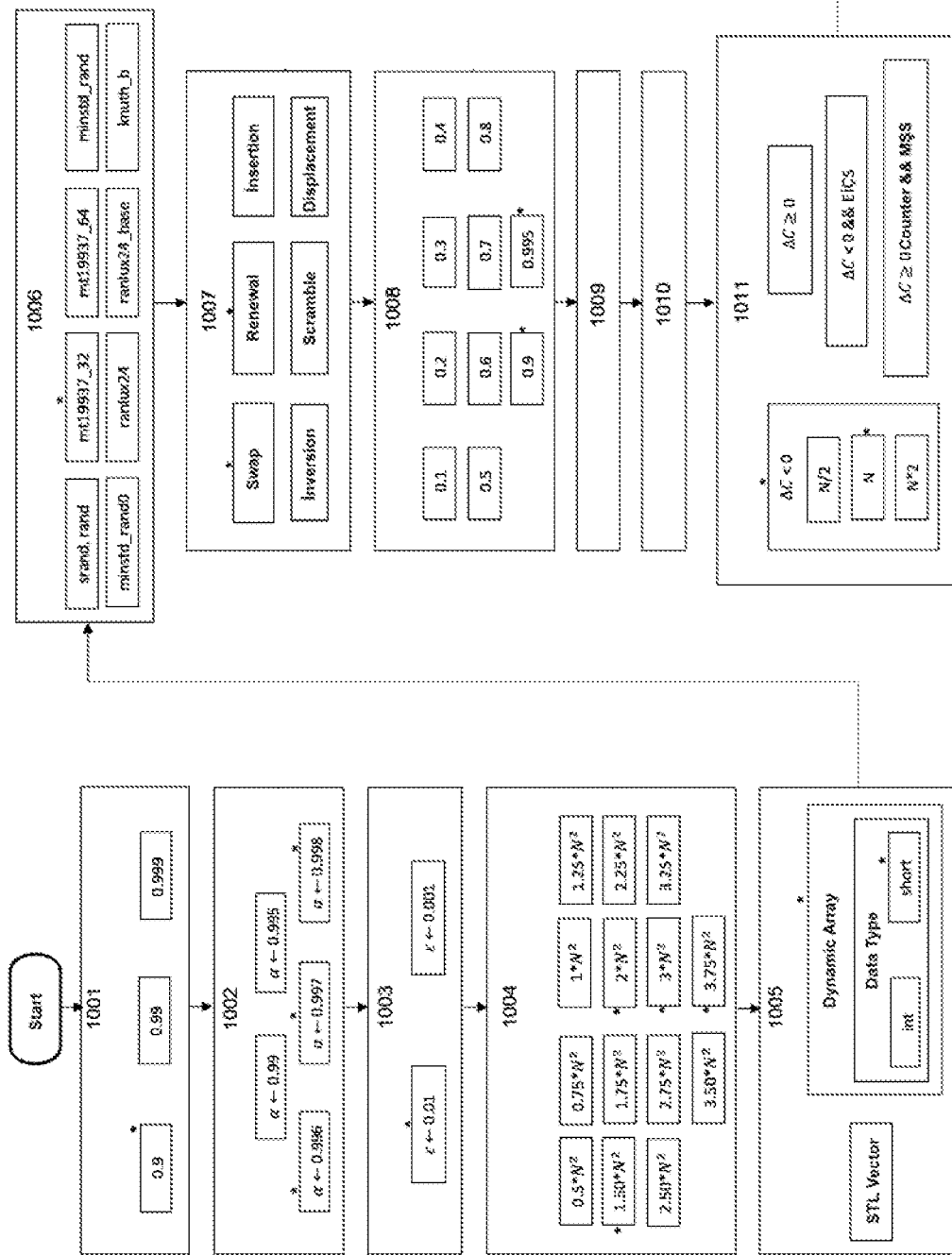
FIG. 1A and FIG. 1B provide the schematic flow diagram of the method of the invention and the preferred values (*) in each step of the method.

1001. Determining the initial temperature, which is one of the main parameters that enable to bring a random first solution representing the problem at hand to the global optimum in the simulated annealing approach
1002. Determining the cooling ratio ($\alpha$), which is the parameter that enables the initial temperature and the current temperature to be lowered gradually, when the number of inner loop iterations, that is used to determine how many times the perturbation process is performed to obtain the neighboring solutions, reaches its upper limit at each temperature value
1003. Determining the freezing point ($\varepsilon$), which is the parameter that enables the decision to terminate the algorithm by comparing the temperature with the new temperature reached as a result of reducing the temperature with the cooling ratio
1004. Determining the maximum number of inner loop iterations, which is the parameter that determines how many times the perturbation process will be performed at each temperature in the simulated annealing approach
1005. Determining the data structure which forms the programming structure of the one-dimensional (task-oriented) representation in the algorithm
1006. Determining the random number generation method that provides the random numbers needed by the initial solution and the other functions in the simulated annealing approach
1007. Determining the perturbation method that provides the neighboring solutions by modifying the current solution in the simulated annealing approach
1008. Determining the ratio of exploitation/exploration which indicates the rate of the perturbation methods that will also be determined by the proposed approach
1009. Creating a time profile that enables the determination and evaluation of the time spent by all functions during the search process
1010. Optimizing the cost function that calculates the cost of the solution produced in each iteration in the simulated annealing approach
1011. Determining the inner loop early termination (thermal equilibrium) criteria that allows the transition to a new temperature when the certain inner loop early termination condition is achieved, instead of going to the end of the pre-determined iteration at each temperature
1012. Determining the outer loop early termination criteria that allows the algorithm to be terminated in the cases where the current solution does not change after certain number of iterations
1013. Creating an initial (current) solution using the data structure, the random number generation method and the initial temperature determined by the algorithm
1014. Converting the current solution to a new (next) solution by using the perturbation methods and the exploitation/exploration ratio determined by the algorithm
1015. Calculating the costs of the generated solutions with the optimized cost function
1016. Reducing the temperature by the geometric cooling method by using the cooling ratio ($\alpha$)
1017. Switching to a new temperature (thermal equilibrium state) if the number of solutions exceeds a threshold set by the user, where the cost of the new (next) solution is less than the cost of the current solution
1018. Terminating the program by comparing the freezing point with the new temperature reached as a result of reducing the temperature with the cooling ratio, or by using the outer loop early termination criteria in the cases where the current solution does not change after certain number of iterations
1019. Determining the effect of the compiler and optimization flags by means of testing to reduce the compile time of the algorithm and/or improve the performance
1020. Running the algorithm serially on a single-core microprocessor that the end-user can easily access and in parallel on a multi-core microprocessor by employing the multi-run method
1021. Implementing the proposed method as a hardware on an FPGA
FPGA: Field Programmable Gate Arrays
$\alpha$: Cooling ratio
$\varepsilon$: Freezing point
N: Number of tasks
Sİ: Serial processor
ÇÇİ: Multi-core processor
X: The number of temperature updates where the current solution does not change
EİÇS: Best solution counter
MŞS: Metropolis condition counter ΔC: the difference between the cost of the new solution and the cost of the current solution
O2: Optimization flag
O3: Optimization flag
Ofast: Optimization flag
VS: Visual Studio
Xc: Xcode
LLVM: LLVM Compiler
MSVC++: Microsoft Visual C++
g++: GNU C++ Compiler

DETAILED DESCRIPTION OF THE INVENTION

Figure 1B:
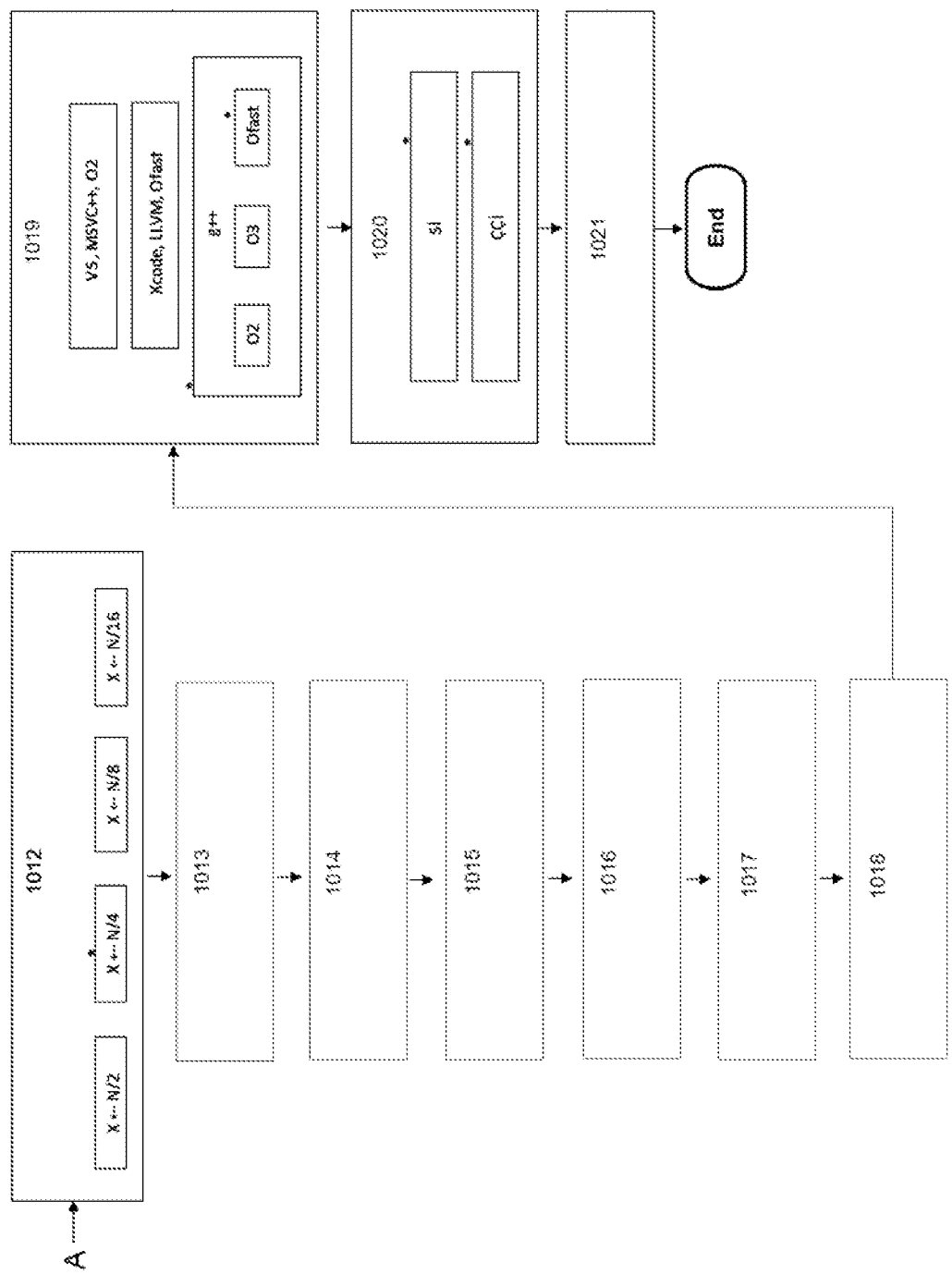

In this detailed description, the innovation of the invention is explained only with examples that have no limiting effect on better understanding of the subject. Our invention relates to a method that enables task scheduling with a simulated annealing-based approach that provides task scheduling optimization in cloud computing infrastructures with multi-tasking and node structure that perform the big data analysis. In FIG. 1A and FIG. 1B, the flow chart of the method of the invention is given. Accordingly, the method comprises the process steps of; determining the initial temperature, which is one of the main parameters that enable to bring a random first solution representing the problem at hand to the global optimum in the simulated annealing approach (1001), determining the cooling ratio (α), which is the parameter that enables the initial temperature and the current temperature to be lowered gradually, when the number of inner loop iterations, that is used to determine how many times the perturbation process is performed to obtain the neighboring solutions, reaches its upper limit at each temperature value (1002), determining the freezing point (ε), which is the parameter that enables the decision to terminate the algorithm by comparing the temperature with the new temperature reached as a result of reducing the temperature with the cooling ratio (1003), determining the maximum number of inner loop iterations, which is the parameter that determines how many times the perturbation process will be performed at each temperature in the simulated annealing approach (1004), determining the data structure which forms the programming structure of the one-dimensional (task-oriented) representation in the algorithm (1005), determining the random number generation method that provides the random numbers needed by the initial solution and the other functions in the simulated annealing approach (1006), determining the perturbation method that provides the neighboring solutions by modifying the current solution in the simulated annealing approach (1007), determining the ratio of exploitation/exploration which indicates the rate of the perturbation methods that will also be determined by the proposed approach (1008), creating a time profile that enables the determination and evaluation of the time spent by all functions during the search process (1009), optimizing the cost function that calculates the cost of the solution produced in each iteration in the simulated annealing approach (1010), determining the inner loop early termination (thermal equilibrium) criteria that allows the transition to a new temperature when the certain inner loop early termination condition is achieved, instead of going to the end of the pre-determined iteration at each temperature (1011), determining the outer loop early termination criteria that allows the algorithm to be terminated in the cases where the current solution does not change after certain number of iterations (1012), creating an initial (current) solution using the data structure, the random number generation method and the initial temperature determined by the algorithm (1013), converting the current solution to a new (next) solution by using the perturbation methods and the exploitation/exploration ratio determined by the algorithm (1014), calculating the costs of the generated solutions with the optimized cost function (1015), reducing the temperature by the geometric cooling method by using the cooling ratio (α) (1016), switching to a new temperature (thermal equilibrium state) if the number of solutions exceeds a threshold set by the user, where the cost of the new (next) solution is less than the cost of the current solution (1017), terminating the program by comparing the freezing point with the new temperature reached as a result of reducing the temperature with the cooling ratio, or by using the outer loop early termination criteria in the cases where the current solution does not change after certain number of iterations (1018), determining the effect of the compiler and optimization flags by means of testing to reduce the compile time of the algorithm and/or improve the performance (1019), running the algorithm serially on a single-core microprocessor that the end-user can access and in parallel on a multi-core microprocessor by employing the multi-run method (1020) and implementing the proposed method as a hardware on an FPGA (1021).

In the flow diagram shown in FIG. 1A and FIG. 1B, different values are tested at all stages with reference numbers and it is decided that the values in the star-shaped (*) boxes are more appropriate as the search parameters. In this invention, the initial temperature is determined firstly. Initial temperature is one of the main parameters of the simulated annealing method and must have a high value to thoroughly explore the search area. The most important feature of simulated annealing is the probabilistic acceptance of the next solutions that are worse in terms of the cost (that have higher cost values) than the current solution in order to avoid the local optimization. For this reason, the ΔC and T values in the Metropolis criterion and the Boltzmann distribution (P) are used (1). By comparing this distribution with a randomly generated decimal value in the range of [0,1) (2), it is ensured that the solutions that cause an increase in the cost function are also accepted (3).

$$P \leftarrow e^{\frac{-\Delta C}{T}} \quad (1)$$

$$\text{random} \leftarrow [0, 1) \quad (2)$$

$$\text{random} < P \quad (3)$$

Based on the comparison shown above (3), the Boltzmann distribution must be equal to approximately very close to 1, as indicated below (4), in order to avoid getting stuck in the local optimum.

$$P \cong 1 \quad (4)$$
$$e^{\frac{-\Delta C}{T}} \cong 1$$

One of the parameters used in the distribution is temperature (4). The developed computer program used the equation (4) to determine the initial temperature and it is found that in the equation below (5), T is linked to ΔC and a constant value (ln 1).

$$\ln e^{\frac{-\Delta C}{T}} \cong \ln 1 \quad (5)$$

$$\frac{-\Delta C}{T} \ln e \cong \ln 1$$

$$\frac{-\Delta C}{T} \cong \ln 1 \; (\ln e = 1)$$

$$T \cong \frac{-\Delta C}{\ln 1}$$

The average initial temperature for each benchmark was first run until a threshold value (threshold=50) was reached, resulting in an average value for the cases where $\Delta C$ is positive. Then with the average $\Delta C$ value;

$$T \cong \frac{-\Delta C}{\ln 1} \quad (6)$$

initial temperature was determined using the formula (6). In this equation, ln 0.9, ln 0.99, and ln 0.999 are used instead of ln 1; and the best results were observed with ln 0.9. Thus, the manual initial temperature input for each of the data sets is prevented.

Instead of manually entering the initial temperature in the program, the Metropolis criterion in the method is tested with different coefficients and a hot enough temperature value is reached. Then, a solution representation is created using a dynamic array data structure among different data structures to represent the problem at hand. Accordingly, the method starts with an initial (current) solution created using the mt19937_32 random number generation method. Eight different random number generators have been tested to meet the random number requirement. The mt19937_32 random number generator used in this study is defined in the random library of C++. This random number generator uses the seed (an integer value to be used by the random number generator algorithm) provided by random_device as input and produces the random number required for the program as output. Thus, the machine index values produced by this generator in the range of [0, N) are placed in the solution to run each task.

Each subsequent step transforms the existing solution into a new (next) solution using the perturbation methods based on swap and renewal and the exploitation/exploration ratio, which determines the rate at which these methods will be used (90% swap and 10% renewal). Simulated annealing requires a large number of neighboring solutions that start with the initial solution and must be produced throughout the search to achieve global optimization. Therefore, neighbor solutions have been achieved by making minor but meaningful changes to the current solution in this study. Six different perturbation methods have been tested to create these minor changes. As a result of the execution of each of the perturbation methods, swap and renewal methods were determined to be the most appropriate ones. In the algorithm developed afterward, it was decided that these two methods should be used together to reach new solutions with small movements. It was assessed that the swap and renewal could be used for exploitation and exploration, respectively. The exploitation/exploration ratio was used to co-operate the swap and renewal method. For this ratio, nine different values in the flow diagram have been tested and the value of 0.9 has been decided.

The costs of the generated solutions (current solution and next solution) are calculated using the cost function. How the cost function works and the mathematical operations used are listed below:

The program utilizes the ETC matrix (this matrix contains the running time of the tasks in nodes in the data set), where the tasks have run times in nodes to calculate the cost of the solution.

The one-dimensional dynamic array (costContainer) structure in the following formula (7) is used to store the cost of running the tasks assigned to each node in the solution.

$$\text{costContainer}[m_j] = \Sigma TC[t_i][m_j] \quad (7)$$

The cost of each node-task mapping taken from the solution in order is obtained from the ETC Matrix and added to the cost of the corresponding node in the cost array (costContainer). Thus, the cost of each node in the solution is calculated by scanning the solution at once.

The next solutions that have a cost less than the current solution are accepted unconditionally, while the next solutions with the costs greater than the current solution are accepted probabilistically. In this way, the method becomes free from being stuck at the local optimum.

The method uses the maximum number of inner loop iterations to determine how many times the perturbation process is performed at each temperature. To determine the number of iterations, a heuristic formula based on the number of tasks (N) contained in the data sets and the Beta coefficient has been produced (8).

$$\text{Beta}*N^2 \quad (8)$$

Based on the formula (8), the results reached by using the fourteen different Beta values in the flow diagram were tested and among them;

$1.50*N^2$, $2*N^2$, $3*N^2$, $3.75*N^2$ values are used.

The initial temperature and subsequent current temperatures are regularly cooled/reduced by the geometric cooling method using the cooling ratio ($\alpha$) when the maximum number of inner loop iterations reaches its upper limit. In order to stabilize the temperature change, the initially determined cooling ratio ($\alpha$) is kept constant throughout the search. In addition, instead of going to the end of the maximum number of inner loop iterations initially determined at each temperature, the transition to the new temperature is made when the inner loop early termination criteria (thermal equilibrium) (criteria that includes the case that the number of solutions where the cost of the new solution is less than the cost of the current solution exceeds a user-defined threshold) is met. On the other hand, by comparing the freezing point ($\varepsilon$) and the new temperature reached as a result of reducing the temperature with the cooling ratio ($\alpha$), the program is terminated when the temperature drops below the freezing point or the outer loop early termination criteria (the criteria containing the situation that the current solution does not change after certain number of iterations) is met. The time profile of the program is created in order to evaluate the time spent by all functions in the program during the search and to determine the rate at which each function affects the running time of the program. In addition, different compilers and optimization flags are tested in order to reduce the compilation and running time of the program and/or to highlight the performance of the algorithm. One of the most important factors affecting the running time of a computer program that produces accurate results is the compiler used. The application that compilers depend on, the type of memory they use, and the processor speed of the environment directly affect the run time of the program. When the algorithm is run with three different compilers (g++, LLVM and MSVC++), it is determined that each compiler has a difference in the time to run the program, and the g++ compiler that gives the optimal run time is selected. Optimization flags are used in each compiler to reduce the program compilation times of the compilers and/or to highlight the performance of the code. The program is compiled with three different optimization flags (O2, O3, Ofast) belonging to the g++ compiler. It has been observed that the effect of each optimization flag on the time to compile the algorithm is different and the best execution time is achieved by the Ofast flag.

This method will eventually be run serially and parallel on a microprocessor, followed by an implementation on FPGA using the Verilog hardware description language. Due to this hardware, task-server mapping will be performed much faster with producing near-optimal results.

For twelve famous benchmarks created by the Braun model, each containing 512 tasks and 16 nodes (servers), the best latency values reached by the current studies in the literature (Min-Min [1], Sufferage [1], cMA [2], MA [4], TS [3], MA+TS [4], SGA [5], NSGA-II [6], GA [7], PGA [7], CHC [7], pCHC [7], pµCHC [8]) and the best latency values reached by our work (Serial SA) are listed in Table 1 in FIG. 2 and Table 2 in FIG. 3.

REFERENCES

Min-Min, Sufferage
[1] Xhafa, F., Durresi, A., Barolli, L., 2007. Batch mode scheduling in grid systems. International Journal of Web and Grid Services, Vol. 3, No. 1, 19-37.
Celluler Memetic Algorithm (cMA)
[2] Xhafa, F., Alba, E., Dorronsoro, B., Duran, B., 2008. Efficient Batch Job Scheduling in Grids Using Cellular Memetic Algorithms. Metaheuristics for Scheduling in Distributed Computing Environments, 273-299.
Tabu Search (TS)
[3] Xhafa, F., Carretero. J., Alba, E., Dorronsoro, B., 2008. Design and evaluation of tabu search method for job scheduling in distributed environments. Proceedings of the 22th International Parallel and Distributed Processing Symposium, 1-8.
Memetic Algorithm (MA) ye MA+TS
[4] Xhafa, F., 2007. A Hybrid Evolutionary Heuristic for Job Scheduling on Computational Grids. Hybrid Evolutionary Algorithms, Abraham, A., Grosan, C., Ishibuchi, H. (eds). Studies in Computational Intelligence, Berlin, 269-311.
Struggle Genetic Algorithm (SGA)
[5] Xhafa, F., Duran, B., Abraham, A., Dahal, K. P., 2008. Tuning Struggle Strategy in Genetic Algorithms for Scheduling in Computational Grids. Neural Network World, 18 (3), 209-225.
Non-Dominated Sorting Genetic Algorithm (NSGA-II)
[6] Subashini, G., Bhuvaneswari, M. C., 2010. A Fast and Elitist Bi-Objective Evolutionary Algorithm for Scheduling Independent Tasks on Heterogeneous Systems. ICTACT, Journal on Soft Computing, Vol. 1, 9-17.

Genetic Algorithm (GA), Parallel Genetic Algorithm (PGA), Cross Heterogeneous Cataclysmic (CHC), Parallel Cross Heterogeneous Cataclysmic (p-CHC)
[7] Nesmachnow, S., Cancela, H., Alba, E., 2010. Heterogeneous computing scheduling with evolutionary algorithms. Soft. Comput. 15(4), 685-701.
Parallel Micro Cross Heterogeneous Cataclysmic (pµ-CHC)
[8] Nesmachnow, S., Cancela, H., Alba, E., 2012. A parallel micro evolutionary algorithm for heterogeneous computing and grid scheduling. Appl. Soft Comput. 12(2), 626-639.

The invention claimed is:
1. A method that enables task scheduling with a simulated annealing-based approach that provides task scheduling optimization in cloud computing infrastructures with multi-tasking and node structure that perform the big data analysis, comprising the following process steps:
determining the initial temperature, which is one of the main parameters that enable to bring a random first solution representing the problem at hand to the global optimum in the simulated annealing approach (1001),
determining the cooling ratio ($\alpha$), which is the parameter that enables the initial temperature and the current temperature to be lowered gradually, when the number of inner loop iterations, that is used to determine how many times the perturbation process is performed to obtain the neighboring solutions, reaches its upper limit at each temperature value (1002),
determining the freezing point ($\varepsilon$), which is the parameter that enables the decision to terminate the algorithm by comparing the temperature with the new temperature reached as a result of reducing the temperature with the cooling ratio (1003),
determining the maximum number of inner loop iterations, which is the parameter that determines how many times the perturbation process will be performed at each temperature in the simulated annealing approach (1004),
determining the data structure which forms the programming structure of the one-dimensional (task-oriented) representation in the algorithm (1005),
determining the random number generation method that provides the random numbers needed by the initial solution and the other functions in the simulated annealing approach (1006),
determining the perturbation method that provides the neighboring solutions by modifying the current solution in the simulated annealing approach (1007),
determining the ratio of exploitation/exploration which indicates the rate of the perturbation methods that will also be determined by the proposed approach (1008),
creating a time profile that enables the determination and evaluation of the time spent by all functions during the search process (1009),
optimizing the cost function that calculates the cost of the solution produced in each iteration in the simulated annealing approach (1010),
determining the inner loop early termination (thermal equilibrium) criteria that allows the transition to a new temperature when the certain inner loop early termination condition is achieved, instead of going to the end of the pre-determined iteration at each temperature (1011),
determining the outer loop early termination criteria that allows the algorithm to be terminated in the cases where the current solution does not change after certain number of iterations (1012), creating an initial (current) solution using the data structure, the random number generation method and the initial temperature determined by the algorithm (1013), converting the current solution to a new (next) solution by using the perturbation methods and the exploitation/exploration ratio determined by the algorithm (1014), calculating the costs of the generated solutions with the optimized cost function (1015), reducing the temperature by the geometric cooling method by using the cooling ratio ($\alpha$) (1016), switching to a new temperature (thermal equilibrium state) if the number of solutions exceeds a threshold set by the user, where the cost of the new (next) solution is less than the cost of the current solution (1017), terminating the program by comparing the freezing point with the new temperature reached as a result of reducing the temperature with the cooling ratio, or by using the outer loop early termination criteria in the cases where the current solution does not change after certain number of iterations (1018), determining the effect of the compiler and optimization flags by means of testing to reduce the compile time of the algorithm and/or improve the performance (1019), running the algorithm serially on a single-core microprocessor that the end-user can access and in parallel on a multi-core microprocessor by employing the multi-run method (1020), implementing the proposed method as a hardware on an FPGA (1021).

2. The method provides task scheduling with a simulated annealing-based approach according to claim 1, comprising the process step of determining the initial temperature utilizing the formula below:

$$T \cong (-\Delta C)/(\ln 1).$$

3. The method provides task scheduling with a simulated annealing-based approach according to claim 2, comprising the process step of using "ln 0.9" instead of "ln 1" in the associated formula.

4. The method provides task scheduling with a simulated annealing-based approach according to claim 1, comprising the process step of calculating the maximum number of inner loop iterations with the heuristic formula (Beta×$N^2$) based on the number of tasks (N) in the data sets and the Beta coefficient.

5. The method provides task scheduling with a simulated annealing-based approach according to claim 4, comprising the process step of selecting the associated Beta values as 1.5/2/3/3.75.

6. The method provides task scheduling with a simulated annealing-based approach according to claim 1, comprising the process step of selecting the associated freezing point ($\varepsilon$) as 0.01.

7. The method provides task scheduling with a simulated annealing-based approach according to claim 1, comprising the process step of selecting the associated random number generation method as mt19937_32 random number generator.

8. The method provides task scheduling with a simulated annealing-based approach according to claim 1, comprising the process step of selecting the associated perturbation method as swap and renewal methods.

9. The method provides task scheduling with a simulated annealing-based approach according to claim 1, comprising the process step of selecting the associated exploitation/exploration ratio as 0.9.

10. The method provides task scheduling with a simulated annealing-based approach according to claim 1, comprising the process step of the associated cost function using the ETC matrix with the running times of the nodes to calculate the cost of the solution.

11. The method provides task scheduling with a simulated annealing-based approach according to claim 1, comprising the process step of storing the cost of the tasks assigned to each node in the solution of the associated cost function in a one-dimensional dynamic array.

12. The method provides task scheduling with a simulated annealing-based approach according to claim 10 comprising the process step of taking the cost of each node-task mapping from the solution from the ETC matrix and adding it to the cost of the relevant node in the cost sequence of the relevant node.

13. The method provides task scheduling with a simulated annealing-based approach according to claim 1, comprising the process step of compiling the method with the Ofast optimization flag of the g++ compiler.

14. The method provides task scheduling with a simulated annealing-based approach according to claim 7, wherein; the mt19937_32 number generator generates a number within the range of [0, N).

15. The method provides task scheduling with a simulated annealing-based approach according to claim 1, the process step of the next solutions that have a cost less than the current solution are accepted unconditionally, while the next solutions with the costs greater than the current solution are accepted probabilistically.

* * * * *